United States Patent [19]

Bladon et al.

[11] Patent Number: 5,425,873
[45] Date of Patent: Jun. 20, 1995

[54] ELECTROPLATING PROCESS

[75] Inventors: John J. Bladon, Wayland; Wade Sonnenberg, Foxboro; Inna Sinitskaya, Sudbury; Jeffrey P. Burress, Framingham; Christopher P. Esposito, Watertown, all of Mass.

[73] Assignee: Shipley Company LLC, Marlborough, Mass.

[21] Appl. No.: 226,012

[22] Filed: Apr. 11, 1994

[51] Int. Cl.$^6$ ................................................ C25D 5/02
[52] U.S. Cl. ...................................... 205/126; 427/96
[58] Field of Search .................... 427/96, 98; 205/126, 205/169, 210, 223, 920

[56] References Cited

U.S. PATENT DOCUMENTS

| | | | |
|---|---|---|---|
| 3,011,290 | 12/1961 | Shipley, Jr. | 51/103 TF |
| 4,895,739 | 1/1990 | Bladon | 427/304 |
| 4,919,768 | 4/1990 | Bladon | 205/125 |
| 4,952,286 | 8/1990 | Bladon et al. | 205/159 |
| 5,007,990 | 4/1991 | Bladon | 205/126 |
| 5,276,290 | 1/1994 | Bladon | 174/262 |

Primary Examiner—John Niebling
Assistant Examiner—Brendan Mee
Attorney, Agent, or Firm—Robert L. Goldberg

[57] ABSTRACT

A process for electroplating a substrate having a surface comprising metallic and non-metallic regions. The process is characterized by selectively forming a protective film over the metallic regions of the substrate surface and forming a sulfide coating selectively over the remaining portions of said substrate. The protective film enables selective sulfide formation only on metallic sites without formation of a sulfide coating on metallic surface regions of the substrate which would otherwise interfere with metal-to-metal bond during electroplating. Following formation of the sulfide conversion coating, the protective film is removed and the surface of the substrate electroplated.

26 Claims, No Drawings

ELECTROPLATING PROCESS

BACKGROUND OF THE INVENTION

I. Introduction

This invention relates to electroplating nonconductors, and more particularly, to a process for electroplating the surface of a nonconductor using a sulfide coating as a base for direct electroplating. This invention is especially useful for the manufacture of printed circuit boards.

II. Description of the Prior Art

Nonconductor surfaces are conventionally metallized by a sequence of steps comprising catalysis of the surface of the nonconductor to render the same catalytic to electroless metal deposition followed by contact of the catalyzed surface with an electroless plating solution that deposits metal over the catalyzed surface in the absence of an external source of electricity. Metal plating continues for a time sufficient to form a metal deposit of the desired thickness. Following electroless metal deposition, the electroless metal deposit is optionally enhanced by electrodeposition of metal over the electroless metal coating to a desired thickness. Electrolytic deposition is possible because the electroless metal deposit serves as a conductive coating that permits electroplating.

Catalyst compositions useful for electroless metal plating are known in the art and disclosed in numerous publications including U.S. Pat. No. 3,011,920, incorporated herein by reference. The catalyst of this patent consists of an aqueous suspension of a tin—noble catalytic metal colloid. Surfaces treated with such catalysts promote the generation of electrolessly formed metal deposits by the oxidation of a reducing agent in an electroless plating solution catalyzed by the catalytic colloid.

Electroless plating solutions are aqueous solutions containing both a dissolved metal and a reducing agent in solution. The presence of the dissolved metal and reducing agent together in solution results in plate-out of the metal in contact with a catalytic metal tin catalyst. However, the presence of the dissolved metal and reducing agent together in solution may also result in solution instability and indiscriminate deposition of metal on the walls of containers for such plating solutions. This may necessitate interruption of the plating operation, removal of the plating solution from the tank and cleaning of tank walls and bottoms by means of an etching operation. Indiscriminate deposition may be avoided by careful control of the plating solution during use and by use of stabilizers in solution which inhibit indiscriminate deposition, but which also retard plating rate.

Attempts have been made in the past to avoid the use of an electroless plating solution by a direct plating process whereby a metal may be deposited directly over a treated nonconductive surface. One such process is disclosed in U.S. Pat. No. 3,099,608, incorporated herein by reference. The process disclosed in this patent involves treatment of the nonconductive surface with a tin-palladium colloid which forms an essentially nonconductive film of colloidal palladium particles over the nonconductive surface. This is the same tin-palladium colloid used as a plating catalyst for electroless metal deposition. For reasons not fully understood, it is possible to electroplate directly over the catalyzed surface of the nonconductor from an electroplating solution though deposition occurs by propagation and growth float a conductive surface. Therefore, deposition begins at the interface of a conductive surface and the catalyzed nonconductive surface. The deposit grows epitaxially along the catalyzed surface from this interface. For this reason, metal deposition onto the substrate using this process is slow. Moreover, deposit thickness is uneven with the thickest deposit occurring at the interface with the conductive surface and the thinnest deposit occurring at a point most remote from the interface.

An improvement in the process of U.S. Pat. No. 3,099,608 is described in U.K Pat. No. 2,123,036 B, incorporated herein by reference. In accordance with the process described in this patent, following catalysis, a surface is electroplated from an electroplating solution containing an additive that is said to inhibit deposition of metal on the metal surface formed by plating without inhibiting deposition on the metallic sites over the nonconductive surface. In this way, there is said to be preferential deposition over the metallic sites with a concomitant increase in the overall plating rate. In accordance with the patent, the metallic sites are preferably formed in the same manner as in the aforesaid U.S. Pat. No. 3,099,608—i.e., by immersion of the nonconductive surface in a solution of a tin-palladium colloid. The additive in the electroplating solution responsible for inhibiting deposition is described as one selected from a group of dyes, surfactants, chelating agents, brighteners, and leveling agents. Many of such materials are conventional additives for electroplating solutions.

There are limitations to the above process. Both the processes of the U.S. and U.K. patents for electroplating require conductive surfaces for initiation and propagation of the electroplated metal deposit. For this reason, the processes are limited in their application to metal plating solutions of nonconductive substrates in areas in close proximity to a conductive surface. In addition, in practice it has been found that the surface provided with metallic sites is not robust and does not stand up to those chemical treatment compositions used prior to the step of electroplating. For this reason, when the process is used for the manufacture of printed circuit boards, void formation is a significant problem resulting in rejection of circuit boards manufactured by the process.

Improvements in processes for direct electroplating of nonconductors that overcome the deficiencies in the processes of U.S. Pat. No. 3,099,608 and in U.K. Pat. No. 2,123,036 are disclosed in U.S. Pat. Nos. 4,895,739; 4,919,768; 4,952,286; and 5,276,290, all incorporated herein by reference. In accordance with the processes of these patents, an electroless plating catalyst, such as that disclosed in the aforesaid U.K. patent, is treated with an aqueous solution of a chalcogen, such as a sulfur solution, to convert the catalyst surface to a chalcogenide surface. By conversion of the surface to the chalcogenide conversion coating, the coating formed is both more robust and more conductive and electroless plating catalyst does not desorb from the surface during metallization. Consequently, in accordance with the process of said patents, it is possible to form printed circuit boards using formulations that would otherwise attack the catalyst layer such as those solutions used in patterned plating processes.

The processes of the aforementioned patents provide a substantial improvement over the process of the U.K.

Patent. However, it has also been found that treatment of an absorbed catalytic metal on a substrate having both nonconductive portions and metallic portions, such as a printed circuit board substrate, with a sulfide solution results in a formation of a sulfide, on metal surfaces in contact with the solution of the sulfide precursor solution. Therefore, if the process is used in the manufacture of printed circuit boards, both the catalytic metal and the copper cladding or conductors of the printed circuit board base material are converted to a tenaciously adherent sulfide. If the copper sulfide is not removed prior to electroplating, it may reduce the bond strength between the copper and a subsequently deposited metal over the copper, especially within the hole walls of multilayer circuits.

SUMMARY OF THE INVENTION

The process of the invention is directed to electroplating a substrate having a surface comprising conductive (metallic) regions and nonconductive regions, such as a copper clad circuit board substrate, using a process that includes deposition of metallic sites over the substrate, converting at least the surface of those sites to metallic sulfides and electroplating. The process of the invention has for its object the conversion of the metallic sites to sulfides without formation of sulfides on the metallic surface regions of the substrates. This object is accomplished by selectively protecting the metallic regions of the substrate from sulfide formation without protecting the metallic sites. The metallic regions are protected at a point in the processing sequence prior to or during the step of treatment with the sulfide film former. In the preferred embodiment of the invention, using a copper clad printed circuit board base material for purposes of illustration, a protective film is formed on the copper cladding by treating the copper cladding with a solution of a copper complexing agent that adsorbs onto the copper and reacts with the copper to form an insoluble, protective, non-reactive layer of a copper complex over the surface of the copper cladding. It has been found that the film of the copper complex prevents sulfide formation and may be readily removed during subsequent processing steps.

DESCRIPTION OF THE PREFERRED EMBODIMENTS

The subject invention is suitable for the manufacture of a variety of commercial articles where a metal deposit is desired over a surface of a nonconductor. However, the invention is especially useful for fabrication of printed circuit boards. For this reason, the description that follows is directed primarily to printed circuit board manufacture.

In printed circuit board manufacture, the substrate commonly used is an epoxy substrate filled with glass fibers and copper clad on at least one of its surfaces. As is known in the art, the epoxy can be substituted or mixed with other resins for specific purposes.

In the manufacture of a double-sided printed circuit board, a first step comprises the formation of through-holes by drilling or punching or any other method known to the art. Following formation of the holes, it is desirable to employ the conventional steps of rinsing with an organic solution to clean and degrease the board. This is followed by desmearing the hole walls with sulfuric acid, chromic acid, permanganate, or plasma etching. Following desmearing, the circuit board base material is conventionally treated with a glass etch that removes glass fibers extending into the holes from the hole walls. This is followed by a solution that neutralizes acid residues and then the hole walls are conditioned to promote catalyst adsorption. Such solutions are often referred to as conditioners and typically comprise an aqueous alkaline surfactant solution for cleaning soil and a quaternary amine to condition the hole wall. This treatment step, by itself, is old in the art and does not constitute a part of the invention.

Following formation and treatment of the holes, the next steps in the processing sequence involves formation of metallic sites over the non-conducting surfaces. One method used in the prior art for formation of metallic sites involves catalysis of the circuit board substrate with a colloidal catalyst composition. This is typically accomplished in two steps. The first step comprises immersion of the part in a catalyst pre-dip solution. Such solutions consist of the same medium as the catalyst solution but do not contain a colloidal metal. The purpose of the pre-dip is to prevent the pH and chloride concentration of the catalyst from being altered by dragging in rinse water. As with the cleaner conditioner, the catalyst pre-dip is a conventional step and does not constitute a part of the subject invention. The next step in the process comprises catalysis of the surface of the nonconductor. Catalysis involves immersion of the nonconductor into an aqueous catalyst composition. The catalysts of U.S. Pat. Nos. 3,011,920 and 3,874,882 are preferred catalysts for this purpose. These catalysts comprise the reduction product formed by the reduction of a noble or precious catalytic metal by tin in acidic medium. The reduction product of palladium by tin in acidic media is the most preferred catalytic material for purposes of this invention. Non-noble metal catalysts such as nickel and copper are also suitable, but lesser preferred, especially in the manufacture of printed circuit boards using pattern plating procedures. Suitable non-noble metal catalysts include copper, nickel, cobalt, etc. and are disclosed in U.S. Pat. Nos. 3,993,799 and 3,993,491, incorporated herein by reference. The step of catalysis is accomplished by immersion of the nonconductor in the catalyst solution for a period of time ranging between 1 and 10 minutes. Catalyst temperature can wary between about room temperature and 150° F. The procedure used to catalyze the nonconductor is in accordance with prior art procedures and does not constitute a part of the subject invention. Following catalysis, the nonconductor is optionally contacted with a solution identified in the art as an accelerator. This material is typically used when the catalyst is one formed by the reduction of the catalytic metal with tin. The reduction reaction forms a tin oxide protective colloid that is believed to insulate the catalytic metal. The accelerator removes at least a part of the tin oxide. A suitable accelerator is a mild acid solution such as hydrochloric acid or perchloric acid. Acceleration is accomplished by immersion of the nonconductor in an aqueous solution of the accelerator for a period of time ranging between 30 seconds and 2 minutes at a temperature ranging between about room temperature and 150° F. Unlike the step of catalysis, the step of acceleration is not mandatory, but preferred. The procedure used for acceleration is in accordance with prior art procedures and does not constitute a part of the subject invention.

Following catalysis of the board, the board is prepared for electrolytic deposition. In accordance with the procedures of this invention, the sulfide treatment solutions comprise a sulfur precursor preferably dissolved in a suitable solvent. For metal plating operations, aqueous solutions are preferred and in accordance with a preferred embodiment of the invention, an aqueous solution of a water soluble sulfur salt may be used. Most preferred are alkali and alkaline earth metal divalent sulfur salts such as sodium, potassium and lithium sulfides and thiosulfates. Sodium thiosulfate is most preferred. The concentration of the salt in solution may vary between about 1.0 to 200 g/l of solution or more, from 100 to 160 g/l being preferred.

In accordance with the process of the invention, following the formation of metallic sites over the substrate, the metallic regions of the substrate are protected from reaction with the sulfide treatment solution while the metallic sites are left unprotected. There are various ways to form a protective film over the metallic regions. For example, the substrate can be removed from solution and the metallic regions of the substrate selectively coated such as by coating the metallic regions with a hydrophobic film former such as an oil or film-forming polymer. A suitable film-forming polymer could be a water soluble polymer inclusive of carboxymethyl cellosolve and polyvinyl pyrrolidone or an aqueous insoluble material such as a polyurethane or a vinyl polymer. A preferred method for applying a separate layer of a film former would be by roller coating using the procedures of U.S. Pat. No. 3,535,157, incorporated herein by reference. By use of this roller coating procedure, the film former is prevented from entering the holes in the circuit board substrate.

As an alternative to a polymeric film former, the surface of the metallic regions can be inactivated by immersion in a passivating material such as mercapto benzotriazole in a relatively low concentration such as about 0.1 to 2.0 g/l of solution. It is known in the art that immersion of a copper surface in mercapto benzotriazole selectively passivates metal and prevents its reaction with other materials.

A preferred method for forming a protective film over the metallic regions in accordance with the invention utilizes the differing chemical reactivities of the metallic regions of the substrate and the metal catalytic sites recognizing that for this embodiment of the invention, the metal of the metallic regions must differ from the metal comprising the metallic sites. In circuit board manufacture, the metallic regions of the substrate would typically be copper while the metallic sites would typically be a catalytic metal such as a noble metal—i.e., palladium or a tin-palladium alloy or a non-noble metal such as nickel, copper or cobalt. Consequently, for circuit board manufacture, the conventional process would result in the metallic sites and metallic surface regions possessing the required differential reactivity provided the metal of the metallic sites and the metallic regions of the substrate differ from each other—e.g., a copper catalyst would not be used to form the metallic sites when electroplating copper over the substrate.

In accordance with the preferred embodiment, a treatment solution is used that selectively adsorbs and reacts with the metallic regions to form a non-reactive protective film over the metallic regions without formation of a protective film over the metallic sites. The protective film is formed by reaction of the metallic regions with the treatment solution. For this embodiment of the invention, a preferred treatment solution would comprise a copper complexing agent that forms an essentially insoluble copper complex with the copper, but is non-reactive with the metal comprising the metallic sites. The copper complexing agent selectively reacts with the copper cladding of the circuit board base material thereby forming a complexed, protective layer of a copper complex over the surface. For purposes of the invention, the copper complex is desirably insoluble in the treatment solution to prevent its being washed from the metallic regions of the substrate during treatment with the various treatment solutions. Though not wishing to be bound by theory, it is believed that the copper complexes function by reacting with the surface layer of the copper regions thereby preventing the surface layer of copper from reacting with the sulfide in the sulfide treatment solution. Suitable copper complexing agents are known to the art and disclosed by Martell, Arthur Earl, *Critical Stability Constants*, Volume 1 to 6, Plenum Press, New York, 1989, incorporated herein by reference. Preferred copper complexing agents are aromatic and heterocyclic nitrogen compounds having at least one nitrogen atom in the ring. Suitable examples of such complexing agents include N,N-dipyridyl, 2-aminomethyl pyridine, phenanthroline and neocuporine. Most preferred copper complexing agents are copper I complexing agents.

Using the copper complexing agent to form the protective film, film formationt is accomplished by immersion of the substrate into an aqueous solution of the copper complexing agent or the sulfide conversion solution containing the copper complexing agent. Whether the copper complexing agent is used as a separate solution or added directly to the sulfide solution, it is contained in solution in an amount at least sufficient to form the protective film over the metallic surface regions of the substrate when in contact with the film former. This concentration is not critical. Preferably, the concentration of the film former in solution is at least 0.01 millimoles (mM), more preferably, varies between 0.05 and solution saturation and most preferably varies between 0.1 and 0.5 mM. The pH of the solution is desirably maintained alkaline, preferably at a pH varying between 7 and 14 and more preferably, between 10 and 12.5. Treatment conditions are not critical. Typically, treatment time may vary from several seconds up to 10 minutes or more. Treatment temperature may be at room temperature or at elevated temperature, in part dependent upon the reactivity of the film former with the metallic surface regions of the substrate.

The protective film is typically formed over the metallic surface regions of the substrate prior to the step of conversion of metallic sites to metallic sulfide unless the protective film is formed using a copper complexing agent in which case, as explained above, the protective film may be formed prior to the step of conversion or simultaneously with the conversion step. Contact with the complexing agent may be by use of the complexing agent as a separate treatment solution or by addition of the agent to a treatment solution such as the accelerator solution.

The sulfide solutions used to convert the metallic sites to a sulfide typically comprise a sulfur precursor preferably dissolved in a suitable solvent such as water. In accordance with a preferred embodiment of the invention, an aqueous solution of a water soluble sulfur salt may be used. Most preferred are alkali and alkaline earth metal sulfide solutions such as solutions of sodium, potassium and lithium sulfides and thiosulfates. The concentration of the salt in solution is not critical and can vary between about 1.0 to 200 g/l of solution or more and preferably, in an amount of from 100 to 160 g/l. The protective film former may be added to the solution of the sulfide salt in concentrations as set forth above. Treatment conditions are also as set forth above.

Contact of the substrate with the solution of the sulfide results in conversion of the layer of metallic sites to a dark brown to black conversion coating suitable for direct electroplating. The remaining metallic surface regions of the substrate having the protective layer remain relatively unchanged in appearance by the sulfide treatment solution. If the protective layer had not been formed, contact of the metallic surface regions with the sulfide solution would have resulted in the formation of a metallic sulfide over the surface of these regions—i.e., in circuit board manufacture, copper sulfide. The sulfide formed is a dense, black, tenacious layer insoluble in common etchants and difficult to remove from the surface of the metallic regions, especially from copper edges exposed within the hole walls. The metallic sulfide surface is undesirable as it would interfere with bonding between the metallic surface regions and a subsequently applied metal electroplate.

Following treatment with the sulfide treatment solution, the metallic surface regions are etched with an etchant. This is a conventional step used to remove surface contaminants from the metallic surfaces such as grease and oxides. Though a conventional step, the step of etching is a significant step in the process of this invention as the etching step removes the protective film from the metallic regions of the surface. Conventional etchants are suitable for this process such as, for example, a sulfuric acid-hydrogen peroxide pre-etch such as PREPOSIT® 746 Etchant available from Shipley Company of Marlborough, Mass. Addition of acetic acid to this solution significantly improves results. The etchant may be used at room temperature for a period of time ranging between 1 and 3 minutes. The use of this etchant effectively removes soil and contaminants as well as the protective film from the metallic surface regions of the substrate.

The next step in the process comprises electroplating directly over the sulfide conversion coating avoiding an intermediate step of electroless metal plating. The electroplating procedure is similar to the procedure disclosed in the above-referenced U.K. Patent, but careful control of the electroplating parameters as required in the process of the U.K. Patent is not necessary in the process of this invention. The electroplating process may use electroplating solutions such as those disclosed in the U.K. Patent. The preferred electroplating metals in accordance with the invention are copper and nickel though the process is suitable for electroplating of any desired metal. A typical electroplating solution comprises an aqueous acid solution of the metal desired to be plated together with proprietary additives from the groups of dyes, surfactants, chelating agents, brighteners, leveling agents, etc. Typical acids used in the formulation of said baths comprise those with a high ionic dissociation constant for maximum conductivity such as sulfuric acid, fluoroboric acid, sulfamic acid, etc. Dyes typically used in such baths include methylene blue, methyl violet, and other N-heterocyclic compounds; triphenyl methane type dyes and aromatic amines, imines and diazo compounds. Suitable surfactants included in such baths typically include non-ionic surfactants such as alkylphenoxy polyethoxyethanols, e.g., octylphenoxy, polyoxyethanol, etc. Surfactants including wetting agents and water soluble organic compounds such as compounds containing multiple oxyethylene groups have been found to be effective. A preferred group of said compounds include polyoxyethylene polymers having from as many as 20 to 150 repeating units. Also included in this class of materials are block copolymers of polyoxyethylene and polyoxypropylene. The additives described above are added to the solution in conventional concentrations.

The electroplating procedure is conventional. The part to be plated is used as a cathode in a conventional electroplating cell. Current density is conventional and varies typically within a range of from 10 to 40 amps/ft.$^2$. Theoretically, a low initial current density should be preferred with current density increased as an initial deposit is formed. This would be expected to prevent burn off of the thin conversion coating. However, in practice, adverse results caused by a high initial current density have not been observed. A preferred current density range, is from 15 to 30 amps/ft.$^2$. The plating solution is maintained at a temperature ranging between room temperature and about 100° F. Plating is continued for a time sufficient to form a deposit of desired thickness. For circuit board manufacture, a desired thickness may range between 0.5 and 2.0 mils, typically from 1 to 1.5 mils. A plating time of from 15 to 90 minutes would typically be required to obtain a deposit of the preferred thickness within the preferred range of current densities. The deposit formed by the process is uniform in thickness, free of defects and strongly bonded to the surface of the nonconductor over which it is plated. Bond strength is satisfactory to withstand solder shock testing as conventionally used in printed circuit board manufacture.

EXAMPLE 1

The following example illustrates the formation of a sulfide conversion coating over a substrate followed by electroplating. All proprietary chemicals are available from Shipley Company of Marlborough, Mass. An FR4 multilayer circuit board having four circuit layers with an array of 14 and 36 mil holes was subjected to the following procedure.

Step 1 Pre-clean and condition:

a. immerse in a proprietary organic solvent identified as MLB 211 at 160° F. for 5 minutes and water rinse;

b. desmear the hole walls with a proprietary permanganate solution identified as MLB 213 Promoter at a temperature of 165° F. for 5 minutes and water rinse;

c. neutralize acid residues by treatment with a proprietary alkaline solution identified as Neutralizer 218-1 at room temperature for 2 minutes and water rinse;

d. condition the hole walls using a proprietary quaternary amine solution identified as XP9420 at a temperature of 105° F. for 5 minutes and water rinse.

Step 2 Catalyze:

a. immerse the substrate in an acidic sodium chloride solution identified as CATAPREP® 404 at a temperature of 70° F. for 1 minute and water rinse;

b. immerse the substrate in an acidic solution of a palladium-tin colloid identified as CATAPOSIT® 44 catalyst at a 3% strength at a temperature of 115° F. for 5 minutes and water rinse.

Step 3 Accelerate:

Immerse the substrate in an acidic accelerating solution identified as Accelerator 5400 at a temperature of 70° F. for 45 seconds and water rinse.

Step 4 Form conversion coating:

Immerse the substrate in a room temperature aqueous sulfide solution consisting of 1M sodium thiosulfate and 1M potassium carbonate maintained at a pH of 11.5 at a temperature of 130° F. for three minutes and water rinse. The board so prepared had a thick dark gray film over copper surfaces.

Step 5 Microetch the copper surfaces:

Immerse the board in a proprietary peroxide sulfuric acid microetch identified as XP9425 at 100° F. for 1 minute and water rinse. Inspection of the copper cladding revealed that most of the surface film had been removed but there were visible residues left on portions of the cladding that were removed during an aerated water rinse. At this point in the procedure, hole walls were not examined.

Step 6 Electroplate:

Electroplate copper from an acid copper electroplating bath identified as ELECTROPOSIT® 1100 acid copper at a current density of 20 amps./ft.$^2$ and at a temperature of 70° F. for 1 hour and water rinse to obtain a deposit having a thickness of about 1.5 mils.

EXAMPLE 2

This example represents the preferred embodiment of the invention.

The procedure of Example 1 was repeated but in this instance, 0.18 mM of neocuproine was added to the solution used to form the conversion coating (Step 4 above). Following this treatment, it was observed that the copper cladding was free of black residue.

EXAMPLE 3

The boards produced by the procedures of Examples 1 and 2 were compared for defects. To induce defects, the boards were subjected to thermal shock by floating the board for 10 seconds on molten solder and letting the boards cool. This procedure was repeated two times for each board prior to inspection for defects. The boards were then cross sectioned and 128 holes examined for interconnection defects. An interconnection defect is separation of the innerlayer copper from the copper of the hole wall. It was found that the board prepared in accordance with the procedure of Example 1 had about 450 interconnect defects (out of a possible total of 1,028) while the board prepared by the procedure of Example 2 had about 15 interconnect defects.

With regard to the above test, substantial variability is encountered from test to test. However, in no instance is the number of defects less than 100 using the procedures of example 1 nor in excess of 50 using the procedures of example 2.

What is claimed is:

1. A process for electroplating a substrate having a surface with metallic and non-metallic regions, said process comprising the steps of providing metallic sites over said metallic and non-metallic regions, said metallic sites being of a metal differing from the metal comprising the metallic regions of the substrate, selectively providing a protective coating over the entire surface of the metallic regions of the substrate by treatment with a treatment solution that reacts with the metallic regions to form a protective coating thereover but which is non-reactive with the metallic sites to reduce the chemical reactivity of said metallic regions without formation of a protective coating over said metallic sites, contacting the substrate with a solution that converts said metallic sites to metallic sulfide sites but is prevented from converting said metallic regions to a sulfide by said protective coating and electroplating said substrate with metal.

2. The process of claim 1 where said metallic sites are formed by contact of said substrate with an aqueous colloidal solution of a metal.

3. The process of claim 2 where said colloidal solution is of a noble metal.

4. The process of claim 3 where said colloidal solution is a colloid of tin and palladium.

5. The process of claim 3 where said metallic sulfide sites are formed by contact of said substrate with an aqueous solution of an alkali or alkaline earth metal sulfide or thiosulfate.

6. The process of claim 5 where the aqueous solution is an alkali metal thiosulfate solution.

7. The process of claim 3 where the protective coating is formed by selectively coating the metallic regions with a hydrophobic material.

8. The process of claim 7 where the hydrophobic material is selected from the group consisting of an organic polymer and an oil.

9. The process of claim 8 where the hydrophobic material is applied by roller coating.

10. The process of claim 1 where said metallic sites are formed by contact of said substrate with an aqueous colloidal solution of palladium and said metallic regions are copper.

11. The process of claim 1 where the protective coating is removed prior to electroplating.

12. A process for electroplating a substrate having a surface with metallic and non-metallic regions, said process comprising the steps of providing metallic sites over said metallic and non-metallic regions, said metallic sites being of a metal differing from the metal comprising the metallic regions of the substrate, selectively providing a protective coating over the entire surface of the metallic regions of the substrate by treatment with a complexing agent that reacts with the metallic regions to form a complex thereof but which is non-reactive with the metallic sites to reduce the chemical reactivity of said metallic regions without formation of a protective coating over said metallic sites, contacting the substrate with a solution that converts said metallic sites to metallic sulfide sites but is prevented from converting said metallic regions to a sulfide by said protective coating and electroplating said substrate with metal.

13. The process of claim 12 where the metallic regions are copper, the metallic sites are of palladium and the protective coating is formed by contacting the substrate with a copper complexing agent that is non-reactive with palladium and forms a complex with copper.

14. The process of claim 13 where the copper complexing agent is a cyclic compound containing at least one cyclic nitrogen atom.

15. The process of claim 14 where the copper complexing agent is a copper I complexing agent that is an aromatic compound having a ring substituted nitrogen atom.

16. The process of claim 15 where the copper complexing agent is selected from the group consisting of N,N'-dipyridyl, 2-aminomethyl pyridine, neocuproine and phenanthroline.

17. The process of claim 16 where the copper complexing agent is neocuproine.

18. A process for electroplating a copper clad circuit board substrate comprising copper clad regions and non-metallic regions, said process comprising the steps of providing noble metal sites over said copper clad regions and said non-metallic regions by contact of said substrate with a solution of a colloidal noble metal, selectively providing a protective coating over said copper clad regions to reduce the chemical reactivity of said copper cladding without protecting said noble metal sites, said protective coating being formed by contacting said substrate with a solution containing a copper complexing agent, contacting said surface with a solution that converts said noble metal sites to metal sulfide sites but is prevented from converting said copper clad regions to a sulfide by said protective coating, removing said protective coating from said copper clad regions and electroplating said substrate with metal.

19. The process of claim 18 where said noble metal sites are formed by contact of said substrate with an aqueous colloidal solution of palladium.

20. The process of claim 18 where said protective film and said noble metal sulfide sites are formed essentially simultaneously by contact of said substrate with an aqueous solution of an alkali or alkaline earth metal sulfide or thiosulfate containing a copper I complexing agent.

21. The process of claim 20 where the aqueous solution is an alkali metal thiosulfate solution.

22. The process of claim 20 where the protective coating is removed prior to electroplating by etching the copper with a copper etchant.

23. The process of claim 20 where the copper complexing agent is a copper complexing agent that is a cyclic compound containing at least one cyclic nitrogen atom.

24. The process of claim 23 where the copper complexing agent which is a copper I complexing agent is an aromatic compound having a ring substituted nitrogen atom.

25. The process of claim 24 where the copper I complexing agent is selected from the group consisting of N,N'-dipyridyl, 2-aminomethyl pyridine, neocuproine and phenanthroline.

26. The process of claim 25 where the copper I complexing agent is neocuproine.

* * * * *